(12) United States Patent
Kin et al.

(10) Patent No.: US 9,490,451 B2
(45) Date of Patent: Nov. 8, 2016

(54) LIGHT-EMITTING ELEMENT AND LIGHT-EMITTING ELEMENT MANUFACTURING METHOD

(75) Inventors: Zenken Kin, Hyogo (JP); Hiroshi Yuasa, Kyoto (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/348,181

(22) PCT Filed: Oct. 7, 2011

(86) PCT No.: PCT/JP2011/005657
§ 371 (c)(1),
(2), (4) Date: Mar. 28, 2014

(87) PCT Pub. No.: WO2013/051071
PCT Pub. Date: Apr. 11, 2013

(65) Prior Publication Data
US 2014/0217394 A1   Aug. 7, 2014

(51) Int. Cl.
*H01L 51/52* (2006.01)
*H01L 51/56* (2006.01)
*H01L 27/32* (2006.01)

(52) U.S. Cl.
CPC ....... *H01L 51/5259* (2013.01); *H01L 51/5253* (2013.01); *H01L 51/56* (2013.01); *H01L 27/3246* (2013.01); *H01L 2227/323* (2013.01); *H01L 2251/5315* (2013.01)

(58) Field of Classification Search
None
See application file for complete search history.

(56) References Cited

U.S. PATENT DOCUMENTS

| | | | |
|---|---|---|---|
| 5,443,922 A | 8/1995 | Nishizaki et al. | |
| 7,170,087 B2 * | 1/2007 | Kidokoro | H01L 51/5259 257/40 |
| 8,354,667 B2 * | 1/2013 | Chen | H01L 51/5088 257/103 |
| 2001/0031379 A1* | 10/2001 | Tera et al. | 428/690 |
| 2003/0168974 A1* | 9/2003 | Matsuki | H01L 51/5048 313/506 |
| 2004/0247938 A1* | 12/2004 | Yamaguchi | H01L 51/5237 428/690 |
| 2005/0116628 A1* | 6/2005 | Lee | H01L 51/5221 313/504 |
| 2009/0115325 A1 | 5/2009 | Matsuzaki et al. | |
| 2010/0237341 A1 | 9/2010 | Okumoto et al. | |

FOREIGN PATENT DOCUMENTS

| | | |
|---|---|---|
| CN | 101431147 | 5/2009 |
| JP | 05-163488 | 6/1993 |

(Continued)

OTHER PUBLICATIONS

International Search Report (ISR) in International Patent Application No. PCT/JP2011/005657, dated Nov. 8, 2011.

(Continued)

*Primary Examiner* — Ali Naraghi
(74) *Attorney, Agent, or Firm* — Greenblum & Bernstein, P.L.C.

(57) ABSTRACT

A light-emitting element includes: a first electrode; a light-emitting functional layer that is provided on the first electrode, and includes a conductive layer as an uppermost layer thereof; a second electrode that is provided on the conductive layer, and has an undesired opening that corresponds to a region of the conductive layer; and a first passivation layer that is provided on the second electrode except on a periphery of the opening. The region of the conductive layer is oxidized. The light-emitting functional layer includes an organic light-emitting layer, and the conductive layer is provided above the organic light-emitting layer.

8 Claims, 7 Drawing Sheets

(56) References Cited

FOREIGN PATENT DOCUMENTS

| JP | 2001-284042 | 10/2001 |
|----|-------------|---------|
| JP | 2003-173873 | 6/2003  |
| JP | 2003-332042 | 11/2003 |
| JP | 2004-362912 | 12/2004 |
| JP | 2009-081093 | 4/2009  |
| JP | 2010-238509 | 10/2010 |
| JP | 2011-522391 | 7/2011  |
| WO | 2009/147801 | 12/2009 |

OTHER PUBLICATIONS

Office Action from Japan Patent Office (JPO) in Japanese Patent Appl. No. 2013-537282, dated Dec. 8, 2015.

Office Action from the Patent Office of the People's Republic of China (SIPO) in Chinese Patent Application No. 201180074002.X, dated Jul. 30, 2015, together with a partial English language translation.

* cited by examiner

FIG. 3
(a)
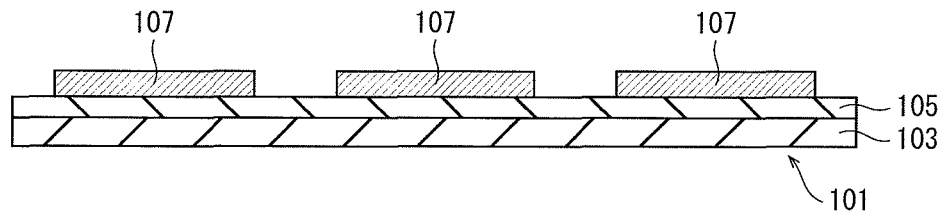
(b)
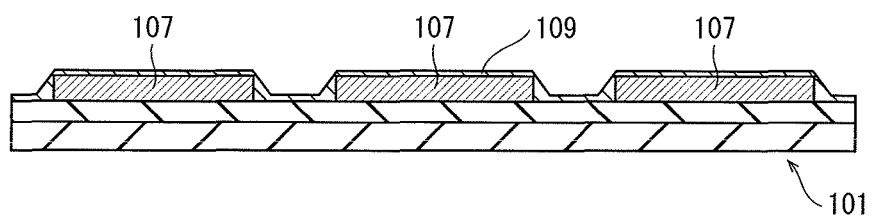
(c)
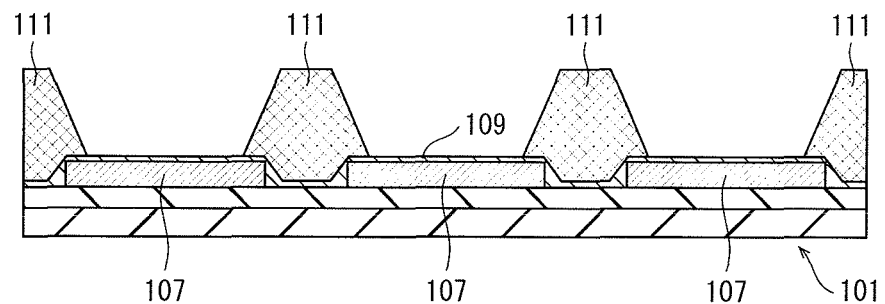

FIG. 4
(a)
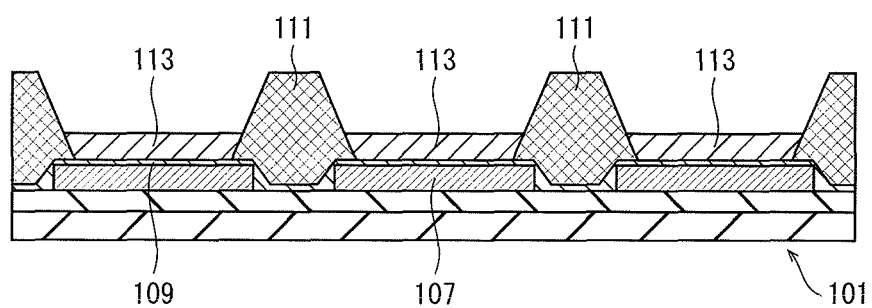
(b)
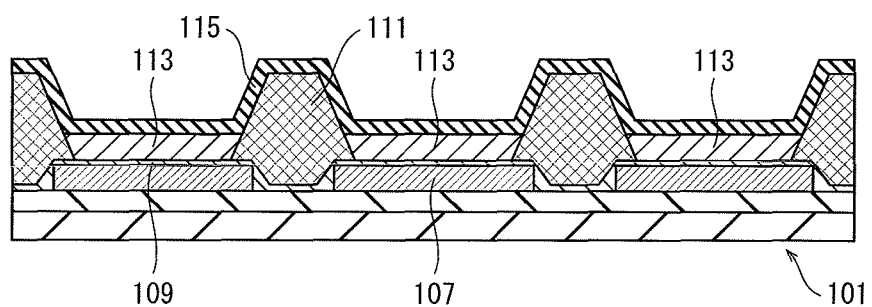
(c)
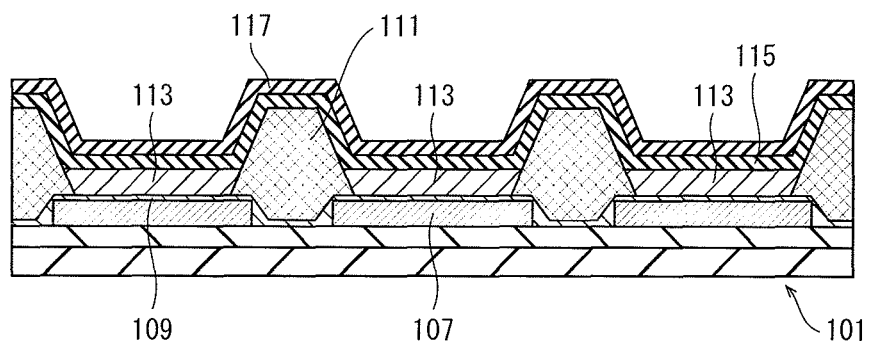

FIG. 5
(a)
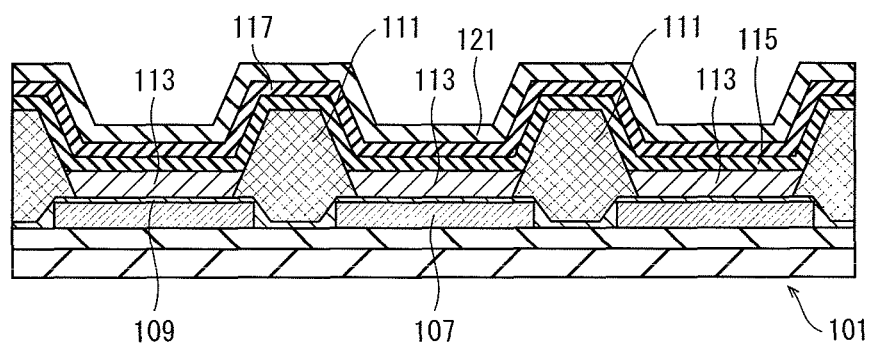
(b)
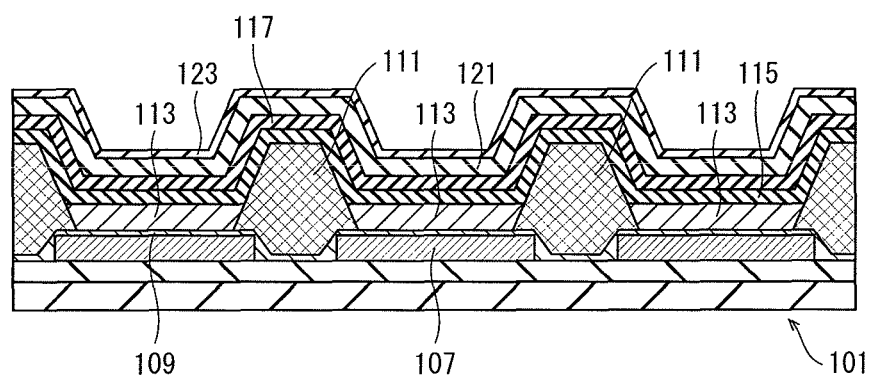

FIG. 7
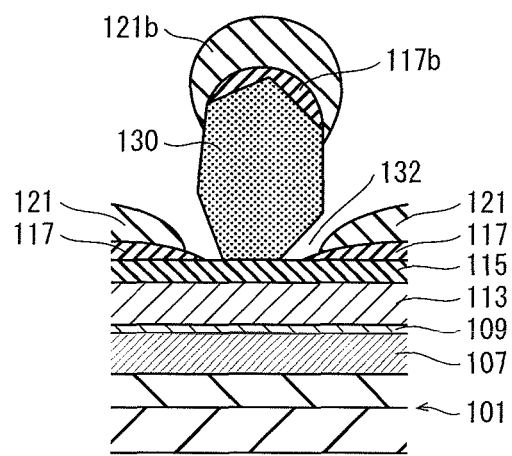
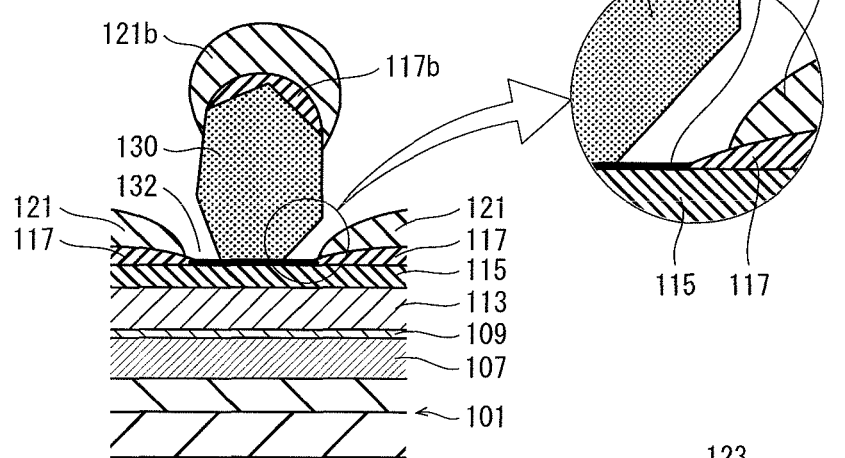
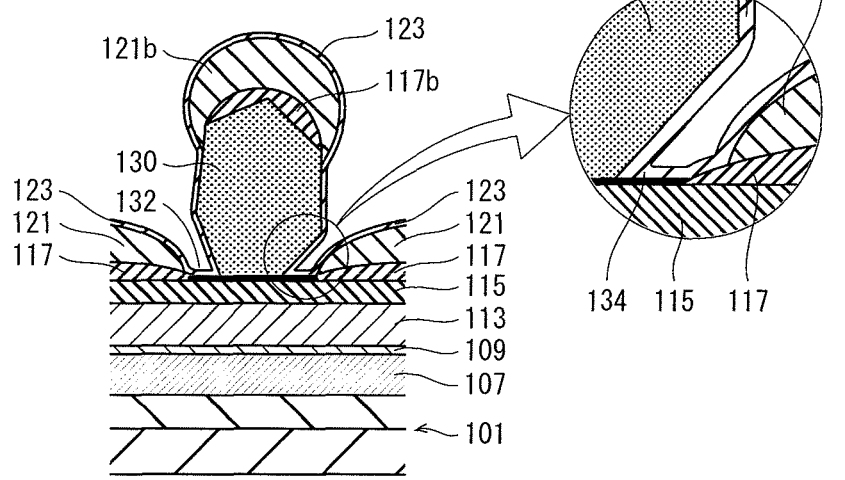

LIGHT-EMITTING ELEMENT AND LIGHT-EMITTING ELEMENT MANUFACTURING METHOD

TECHNICAL FIELD

The present invention relates to a light-emitting element including a first electrode, a light-emitting functional layer, a second electrode, and a passivation layer, and a manufacturing method of the light-emitting element.

BACKGROUND ART

One type of light-emitting elements has the structure in which a light-emitting functional layer including a light-emitting layer, a conductive layer, and so on are interposed between an anode as a first electrode and a cathode as a second electrode.

The light-emitting layer and the cathode are influenced by gas such as moisture and oxygen (hereinafter, referred to also as gas such as moisture, or simply as gas). Specifically, the light-emitting layer has light-emitting properties that are deteriorated due to moisture or the like, and as a result has a short operating life as an element. The cathode varies in electric properties due to oxygen or the like. Large variation in electric properties disables the cathode to supply electrons to the light-emitting layer, and as a result light emission cannot be performed (so-called display defects are caused).

For this reason, a passivation layer is formed on an upper surface of the cathode for example, in order to protect the light-emitting layer and the cathode against gas such as moisture, in other words, in order to prevent gas infiltration.

On the other hand, the light-emitting layer emits light. The light is externally extracted after transmitting through the cathode and the passivation layer (in the case of a display panel of a top emission type). Accordingly, there is a need for the passivation layer to have excellent light transmissive properties in addition to high gas barrier properties. A silicon nitride (SiN) film is for example used for the passivation layer.

Also, in order to further improve the gas barrier properties of the light-emitting element, there has been proposed an art of forming the passivation layer by an atomic layer epitaxy (ALE) method (for example Patent Literatures 1 and 2).

CITATION LIST

Patent Literature

[Patent Literature 1] Japanese Patent Application Publication No. 2001-284042
[Patent Literature 2] Japanese Patent Application Publication No. 2003-332042

SUMMARY OF INVENTION

Technical Problem

Even with adoption of the above passivation layer, however, unevenness in light emission, unevenness in color, or the like sometimes occur.

In the case where any failure occurs during a manufacturing process of light-emitting elements, specifically in the case where for example a conductive foreign substance attaches to a conductive layer included in a light-emitting functional layer, variation in electrical properties of the conductive layer is caused. This results in unevenness in light emission, unevenness in color, or the like.

The present invention was made in view of the above problem, and aims to provide a light-emitting element and a manufacturing method of the light-emitting element in which unevenness in light emission or the like is reduced even in the case where any failure occurs.

Solution to Problem

In order to solve the above problem, one aspect of the present invention provides a light-emitting element comprising: a first electrode; a light-emitting functional layer that is provided on the first electrode, and includes a conductive layer as an uppermost layer thereof; a second electrode that is provided on the conductive layer, and has an undesired opening that corresponds to a region of the conductive layer; and a first passivation layer that is provided on the second electrode except on a periphery of the opening, wherein the region of the conductive layer is oxidized.

In order to solve the above problem, one aspect of the present invention provides a manufacturing method of a light-emitting element that includes a first electrode, a light-emitting functional layer including a light-emitting layer and a conductive layer, a second electrode, and a first passivation layer that are provided on a substrate in respective order, the manufacturing method comprising: forming the first electrode on the substrate; fowling the light-emitting functional layer on the first electrode; forming the second electrode on the light-emitting functional layer; forming the first passivation layer on the second electrode; and exposing, after forming the first passivation layer, the substrate in an oxygen atmosphere to promote oxidation of a region of the conductive layer that is exposed in the oxygen atmosphere.

Advantageous Effects of Invention

According to the light-emitting element relating to one aspect of the present invention and the manufacturing method of the light-emitting element relating to one aspect of the present invention, even in the case where any failure occurs during a manufacturing process of light-emitting elements, specifically, in the case where for example a conductive foreign substance attaches to a conductive layer, a part of the conductive layer where the foreign substance attaches is oxidized. Accordingly, insulation is established between the part of the conductive layer and the foreign substance, and variation in electrical properties of the conductive layer is suppressed and unevenness in light or the like is reduced.

BRIEF DESCRIPTION OF DRAWINGS

FIG. 3(a)-(c) shows an example of a manufacturing process of the display panel.
FIG. 4(a)-(c) shows an example of the manufacturing process of the display panel.
FIG. 5(a) and (b) shows an example of the manufacturing process of the display panel.

FIG. 7(a)-(c) shows the state of a part to which a foreign substance attaches during a manufacturing process.

DESCRIPTION OF EMBODIMENTS

<Aspect>

Figure 1:
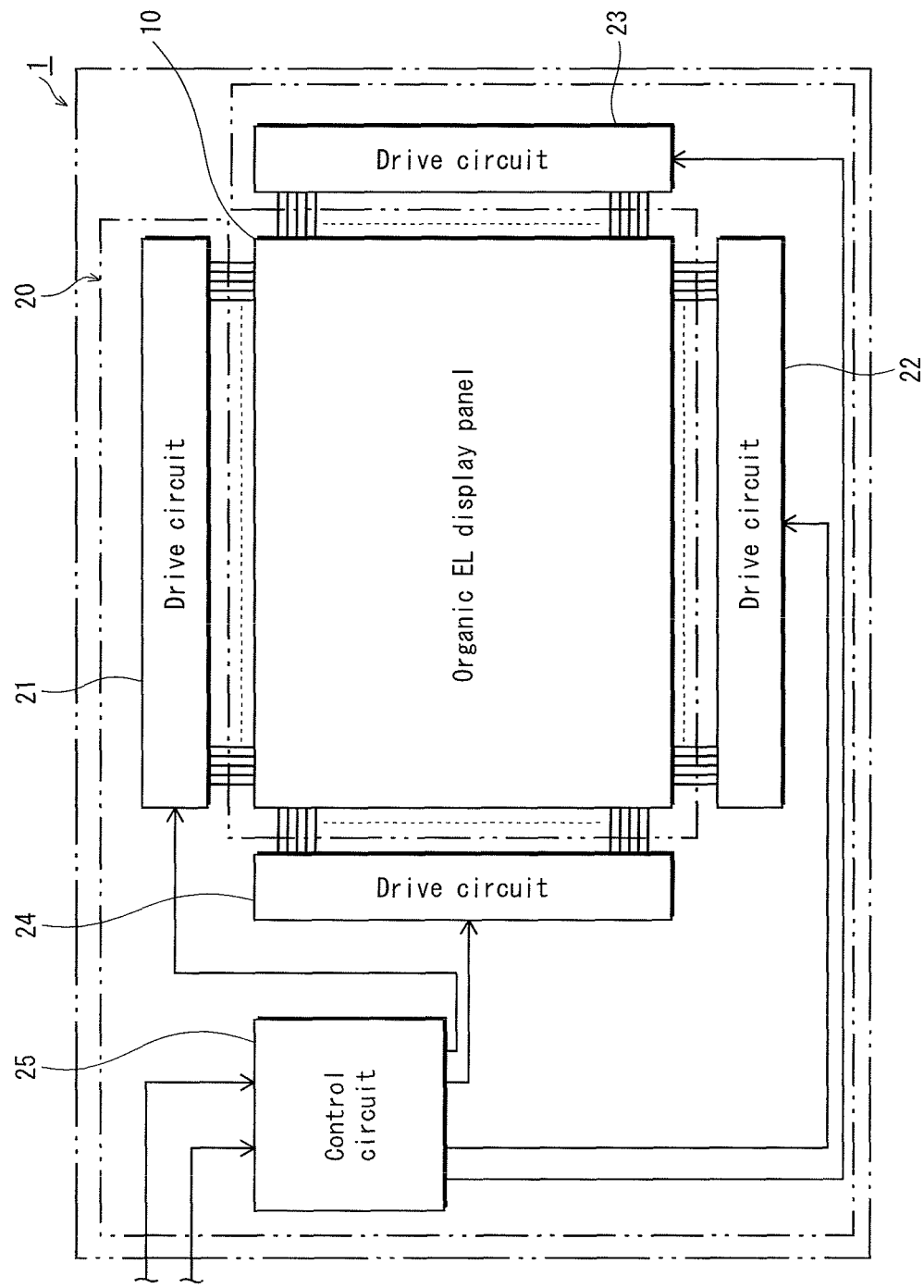
FIG. 1 is a block diagram schematically showing the overall structure of a display device.

One aspect of the present invention provides a light-emitting element comprising: a first electrode; a light-emitting functional layer that is provided on the first electrode, and includes a conductive layer as an uppermost layer thereof; a second electrode that is provided on the conductive layer, and has an undesired opening that corresponds to a region of the conductive layer; and a first passivation layer that is provided on the second electrode except on a periphery of the opening, wherein the region of the conductive layer is oxidized. This reduces unevenness in light emission even in the case where any failure occurs.

Also, the first passivation layer and the periphery of the opening are covered with a second passivation layer that is formed in units of atomic layers. This improves the gas barrier properties.

Also, a foreign substance attaches to the region of the conductive layer, and the foreign substance is fixed to the region due to the region being oxidized. This prevents the foreign substance from blowing onto other parts.

Also, the region of the conductive layer except a part to which the foreign substance attaches is covered with the second passivation layer. This improves the gas barrier properties of the conductive layer.

Also, the foreign substance is covered with the second passivation layer while a layer that is made of the same material as the second electrode and a layer that is made of the same material as the first passivation layer are formed above the foreign substance. This reduces removal of the foreign substance.

Also, the light-emitting functional layer includes an organic light-emitting layer, and the conductive layer is an electron transport layer that transports electrons to the organic light-emitting layer.

One aspect of the present invention provides a manufacturing method of a light-emitting element that includes a first electrode, a light-emitting functional layer including a light-emitting layer and a conductive layer, a second electrode, and a first passivation layer that are provided on a substrate in respective order, the manufacturing method comprising: forming the first electrode on the substrate; forming the light-emitting functional layer on the first electrode; forming the second electrode on the light-emitting functional layer; forming the first passivation layer on the second electrode; and exposing, after forming the first passivation layer, the substrate in an oxygen atmosphere to promote oxidation of a region of the conductive layer that is exposed in the oxygen atmosphere. This allows manufacturing of a light-emitting element in which unevenness in light emission is reduced even in the case where any failure occurs.

Also, in exposing the substrate in the oxygen atmosphere, the substrate is aerated with oxygen for several hundred milliseconds to several seconds. This facilitates to form an oxide film in the conductive layer.

Also, after exposing the substrate in the oxygen atmosphere, a second passivation layer is formed by one of an atomic layer epitaxy method and an atomic layer deposition method. This improves the passivation properties.

The light-emitting element relating to the one aspect of the present invention includes, as the uppermost layer thereof, the conductive layer functioning as the light-emitting functional layer. Focusing on the conductive layer, the light-emitting element is characterized as follows.

A light-emitting element comprises: a first functional layer that includes a first region that is conductive, and a second region that results from oxidation of part of the first region and is insulative; a second functional layer that includes at least one layer having a first part and an opening, the first part being conductive and corresponding to the first region, the opening corresponding to the second region; a first passivation layer that is insulative, and includes a first passivation part covering a surface of the second functional layer, and a second passivation part that is located above the second region such that at least part of the second region is exposed; and a second passivation layer that contains an insulating material, continuously covers respective surfaces of the first passivation part and the second passivation part and the at least part of the second region, and blocks a path reaching the at least part of the second region through a space between the first passivation part and the second passivation part.

Here, the first functional layer corresponds to the above-described conductive layer. The second region included in the first functional layer corresponds to the above-described region of the conductive layer. The layer that is included in the second functional layer and has the first part and the opening corresponds to the above-described second electrode. The opening corresponds to the above-described opening. The first passivation layer corresponds to the above-described first passivation layer, and the second passivation layer corresponds to the above-described second passivation layer.

Also, a foreign substance attaches to a surface of the second region included in the first functional layer. The opening of the second functional layer is formed so as to correspond to the foreign substance. The second passivation part included in the first passivation layer directly or indirectly covers the foreign substance.

Also, the first functional layer is a layer containing an alkali metal or an alkaline-earth metal, and the second functional layer is a cathode.

Further, in other words, the light-emitting element comprises: a functional layer including a first layer that has a lost part and a second layer that has an oxidized part resulting from oxidation of a peripheral part that is peripheral to the lost part; and a passivation member that covers the functional layer.

Here, the first layer corresponds to the above-described first functional layer, and the second layer corresponds to the above-described second functional layer. The first layer and the second layer may be the same or differ from each other.

According to the manufacturing method of a light-emitting element relating to the one aspect of the present invention, on the other hand, the light-emitting element includes, as the uppermost layer thereof, the conductive layer functioning as the light-emitting functional layer. Focusing on the conductive layer, the manufacturing method is characterized as follows.

The manufacturing method of a light emitting element comprises: a first step of forming a first functional layer that is conductive; a second step of forming, on the first functional layer, a second functional layer including at least one layer that is conductive; a third step of forming, on the second functional layer, a first passivation layer that is insulative; and a fourth step of forming, on the first passivation layer, a second passivation layer that is insulative, wherein in the second step, in a region of a surface of the first functional layer where a foreign substance attaches, the second functional layer is formed on a surrounding part that is separated from the foreign substance by a space, in the third step, the first passivation layer is formed so as to cover a surface of the second functional layer and a surface of the foreign substance, except a part corresponding to the space between the foreign substance and the second functional layer formed on the surrounding part; and in the fourth step, the second passivation layer is formed in an oxygen atmosphere so as to cover a surface of the first passivation layer and to intrude into the space that is not covered with the first passivation layer, and oxygen contained in the oxygen atmosphere is reacted, via the space, with an exposed part of the first functional layer where the first passivation layer is not formed so as to oxidize a part of the first functional layer that is in contact with the foreign substance including the exposed part.

Also, in the fourth step, the second passivation layer is formed in an oxygen atmosphere by an atomic layer epitaxy method in which a material for the second passivation layer is evaporated in an atomic state.

Also, the fourth step includes: an oxygen aerating substep of, aerating in an oxygen atmosphere, an intermediate of a light emitting element that constitutes the first passivation layer formed in the third step; and a film forming substep of, after the oxygen aerating substep, forming the second passivation layer on the intermediate by the atomic layer epitaxy method, wherein in the oxygen aerating substep, the intermediate is aerated with oxygen for 100 milliseconds to 20 seconds.

Also, in the second step, the second functional layer is formed in an entire region of the surface of the first functional layer where the foreign substance does not attach.

<Embodiment>

The following description is given with use of a display panel as an example of a light-emitting panel.

1. Display Device

FIG. 1 is a block diagram schematically showing the overall structure of a display device.

As shown in FIG. 1, a display device 1 includes a display panel 10 and a drive control unit 20 that is connected with the display panel 10.

The display panel 10 is for example an organic EL display panel of the top emission type that relies on electroluminescence phenomenon of organic materials. The drive control unit 20 includes four drive circuits 21 to 24 and a control circuit 25 that controls the drive circuits 21 to 24.

The display panel is not limited to an organic EL display panel using organic materials. Alternatively, the display panel may be an inorganic EL display panel using inorganic materials, an organic EL display panel of the bottom emission type, or an inorganic EL display panel of the bottom emission type.

The drive control unit 20 does not need to be arranged in a manner such as described above. Also, the number of drive circuits is not limited to four. For example, a control circuit and a drive circuit may be integrally configured.

2. Display Panel

Figure 2:
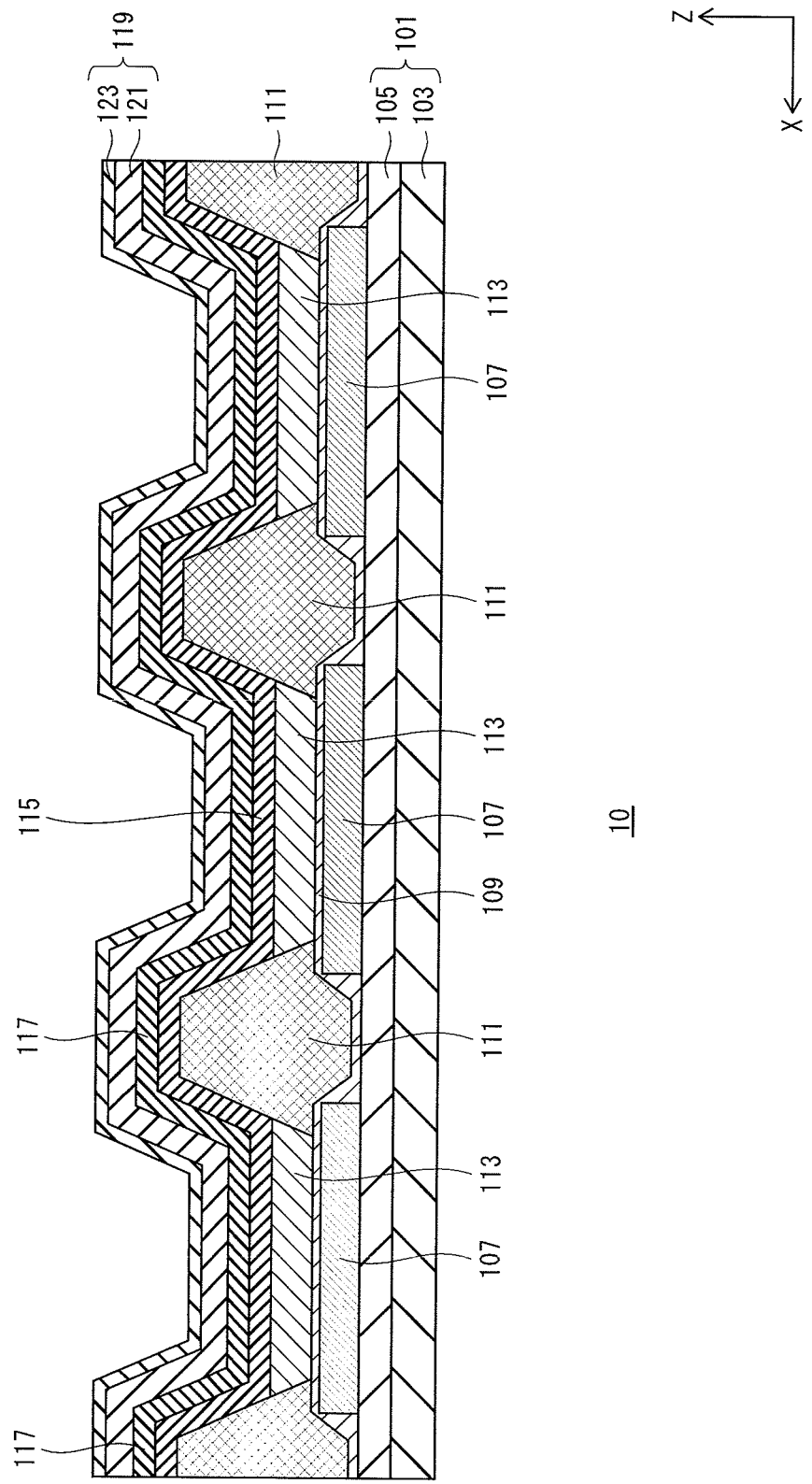
FIG. 2 is a partial cross-sectional view schematically showing main parts of the display panel.

FIG. 2 is a partial cross-sectional view schematically showing main parts of the display panel 10.

As shown in FIG. 2, the display panel 10 includes a substrate 101 on which a plurality of pixels are formed in a matrix.

The pixels are each composed of a plurality of subpixels (specifically three subpixels) that are arranged in an X-direction. The subpixels each correspond to the light-emitting element relating to the present invention. The respective three subpixels for example emit light of red (R), green (G), and blue (B) colors.

The substrate 101 is composed of a TFT substrate 103 and an interlayer insulating film 105 that is formed on the TFT substrate 103. An anode 107 is formed on the substrate 101 in units of subpixels. The anode 107 corresponds to the first electrode of the present invention. In the present Description, a direction viewed from the substrate 101 in which various types of functional layers are layered above the substrate 101 is defined as an upper direction. The upper direction corresponds to a Z-direction in FIG. 2. Also, an upper side is also referred to as a surface side.

A hole injection layer 109 is formed on a region of the substrate 101 where the anode 107 is not formed and on the anode 107. After the anodes 107 are formed on the substrate 101 in one-to-one correspondence with the subpixels, the hole injection layer 109 is formed above substantially the entire surface of the substrate 101. As a result, the hole injection layer 109 has parts located on upper surfaces of the anodes 107 and parts that are each recessed between each two adjacent anodes 107.

A bank 111 is formed on each of regions of the hole injection layer 109 that are located between each two adjacent anodes 107.

As shown in FIG. 2, the bank 111 fills between each two adjacent anodes 107. The bank 111 has a shape protruding from parts of the hole injection layer 109, which are located on the upper surfaces of edge parts of the anode 107, upward (that is, upward in the thickness direction, toward the direction away from the substrate 101, and toward the Z-direction in FIG. 2). The protruding shape here is for example a trapezoidal shape. Note that the banks 111 form a lattice shape in plan view.

On a part of the hole injection layer 109 which is located in each of regions defined by the banks 111 (the regions between adjacent banks 111 in FIG. 2), a light-emitting layer 113 for a predetermined color (any of the above R, G, and B colors here) is provided.

On the light-emitting layer 113 and on a surface of a region of each of the banks 111 that is located higher than the light-emitting layer 113, an electron transport layer 115, a cathode 117, and a passivation part 119 are formed in respective order. The electron transport layer 115, the cathode 117, and the passivation part 119 are each formed so as to be continuous across the regions defined by the banks 111.

The electron transport layer 115 corresponds to the conductive layer of the present invention. Three layers including the hole injection layer 109, the light-emitting layer 113, and the electron transport layer 115 correspond to the light-emitting functional layer of the present invention. The cathode 117 corresponds to the second electrode of the present invention.

The passivation part 119 has a double-layered structure including a first passivation layer 121 and a second passivation layer 123 that is formed on a surface of the first passivation layer 121. The first passivation layer 121 corresponds to the first passivation layer of the present invention.

3. Example of Display Panel (1) Substrate (1-1) TFT Substrate

The TFT substrate 103 is made of a main body of a substrate on which TFT, wiring members, a passivation film (not illustrated) that covers the TFT and so on are formed. The main body of the substrate is an insulating material such as non-alkali glass, soda glass, nonfluorescent glass, phosphate glass, borate glass, quartz, acrylic resin, styrenic resin, polycarbonate resin, epoxy resin, polyethylene, polyester, silicone resin, and alumina. The main body of the substrate may be made of an organic resin film.

(1-2) Interlayer Insulating Film

The interlayer insulating film 105 is provided for flattening unevenness on a surface of the TFT substrate 103, and is made of an insulating material such as polyimide resin and acrylic resin.

(2) Anode

The anode 107 is made of an aluminum (Al) or an aluminum alloy. Alternatively, the anode 107 may be for example made of silver (Ag), an alloy of silver, palladium (Pd), and copper (Cu), an alloy of silver, rubidium (Rb), and gold (Au), an alloy of molybdenum (Mo) and chrome (Cr), an alloy of nickel (Ni) and chrome, or the like.

(3) Hole Injection Layer

The hole injection layer 109 has a function of injecting holes into the light-emitting layer 113. The hole injection layer 109 is for example made of a metal oxide containing an oxide of a transition metal such as tungsten oxide (WOx), molybdenum oxide (MoOx), and molybdenum tungsten oxide (MoxWyOz).

(4) Bank

The banks 111 have a function of partitioning adjacent subpixels. The banks 111 are made of an organic material such as resin, and have insulating properties. Examples of the organic material include acrylic resin, polyimide resin, and novolac-type phenolic resin. The banks 111 should preferably have organic solvent resistance. Furthermore, since the banks 111 sometimes undergo etching processing, baking processing, and so on, the banks 111 should preferably be made of a highly resistant material in order to avoid excessive deformation, transformation, or the like due to such processing.

(5) Light-Emitting Layer

The light-emitting layer 113 that is for example an organic light-emitting layer should preferably be made of a high-polymer material such as polyfluorene, polyphenylenevinylene, polyacetylene, polyphenylene, polyparaphenyleneethylene, poly3-hexylthiophene, and any of respective derivatives of these components. Alternatively, the light-emitting layer 113 should preferably be made of a fluorescent material disclosed in Japanese Patent Application Publication No. H5-163488 such as oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of 8-hydroxyquinoline compound, metal complex of 2-bipyridine compound, complex of Schiff base and group three metal, metal complex of oxine, and rare earth metal complex.

(6) Electron Transport Layer

Examples of the material for the electron transport layer 115 include nitro-substituted fluorenone derivative, thiopyran dioxide derivative, diphenylquinone derivative, perylene tetracarboxyl derivative, anthraquinodimethane derivative, fluoronylidene methane derivative, anthrone derivative, oxadiazole derivative, perinone derivative, and quinolone complex derivative, which are disclosed in Japanese Patent Application Publication No. H5-163488.

Note that from the perspective of further improving electron injection properties, the above material for forming the electron transport layer 115 may be doped with an alkali metal or an alkaline-earth metal, such as sodium (Na), barium (Ba), and potassium (K). In the present embodiment, the material is doped with barium, and as a result the electron transport layer 115 has an electron injection function in addition to an electron transport function.

(7) Cathode

The cathode 117 is an electrode for injecting electrons into the light-emitting layer 113. Since the display panel relating to the present embodiment is of the top emission type, the cathode 117 needs to cause light emitted from the light-emitting layer 113 to transmit therethrough. For this reason, the cathode 117 is a transparent electrode made of ITO, IZO, or the like.

(8) Passivation Part

The passivation part 119 has a function of preventing the light-emitting layer 113 and so on from being exposed to moisture and air.

The first passivation layer 121 is for example made of silicon oxide (SiO), silicon nitride (SiN), silicon oxynitride (SiON), silicon carbide (SiC), carbon-doped silicon oxide (SiOC), aluminum nitride (AlN), aluminum oxide ($Al_2O_3$), or the like.

The second passivation layer 123 is for example made of aluminum oxide ($Al_2O_3$), silicon dioxide ($SiO_2$), aluminum nitride (AlN), aluminum oxynitride ($Al_xO_yN_z$), or the like.

4. Manufacturing Method

Next, a manufacturing process of the display panel 10 is exemplified.

FIG. 3 to FIG. 5 show an example of the manufacturing process of the display panel 10. FIG. 3 to FIG. 5 each schematically show part of the display panel 10.

The display panel 10 is manufactured through the following processes: (1) anode forming process; (2) hole injection layer forming process; (3) bank forming process; (4) light-emitting layer forming process; (5) electron transport layer forming process; (6) cathode forming process; (7) first passivation layer forming process; (8) oxygen exposure process; and (9) second passivation layer forming process. Note that, before the anode forming process, a process of preparing a substrate 101 on which an anode is to be formed is performed.

Since a light-emitting functional layer is formed through the hole injection layer forming process to the electron transport layer forming process, these processes are collectively referred to also as light-emitting functional layer forming process.

The anode forming process corresponds to the forming the first electrode of the present invention. The processes from the hole injection layer forming process to the electron transport layer forming process (the light-emitting functional layer forming process) corresponds to the forming the light-emitting functional layer of the present invention. The cathode forming process corresponds to the forming the second electrode of the present invention. The first passivation layer forming process corresponds to the forming the first passivation layer of the present invention. The oxygen exposure process corresponds to the exposing the substrate of the present invention.

The following describes the processes.

(1) Anode Forming Process

On the substrate 101, which is made of a TFT substrate 103 on which an interlayer insulating film 105 is formed, a metal film that is a material for anodes 107 such as an aluminum (Al) film is formed. The aluminum film is formed for example by a vacuum deposition method such as the sputtering method and the vacuum evaporation method.

After formation of the aluminum film, patterning is performed by photolithography or the like to form the anodes 107 in a matrix (see section (*a*) of FIG. 3). The anodes 107 for example have a film thickness of 100 nm to 200 nm.

(2) Hole Injection Layer Forming Process

On an upper surface of the substrate 101 on which the anodes 107 are formed in a matrix, a tungsten oxide (WOx) film that is a metal oxide film is formed with use of a composition containing tungsten oxide (see section (*b*) of FIG. 3).

The hole injection layer 109 for example has a film thickness of 1 nm to 10 nm, and is formed by a vacuum deposition method such as the sputtering method and the vacuum evaporation method.

(3) Bank Forming Process

Firstly, on the hole injection layer 109 which is formed above the substrate 101, a bank material layer made of an insulating organic material is formed by application or the like. Then, a mask having an opening with a predetermined shape is overlaid on the bank material layer. The bank material layer is exposed to light over the mask, and then unnecessary part of the bank material layer is washed away using a developer. This completes the patterning on the bank material layer, and as a result banks 11 are formed (see section (*c*) of FIG. 3).

The height of the banks 111 from an upper surface of the hole injection layer 109 is for example 1 μm to 2 μm.

(4) Light-Emitting Layer Forming Process

In each of the regions partitioned by the banks 111, an ink composition containing a light-emitting material is dropped by the inkjet method or the like. The ink composition is dried to form a light-emitting layer 113 (see section (*a*) of FIG. 4). The light-emitting layer 113 for example has a film thickness of 10 nm to 100 nm.

(5) Electron Transport Layer Forming Process

After formation of the light-emitting layer 113, an electron transport layer 115 made of nitro-substituted fluorenone derivative or the like is formed on the light-emitting layer 113, which is formed above the substrate 101. The electron transport layer 115 is formed by a vacuum deposition method such as the sputtering method and the vacuum evaporation method (see section (*b*) of FIG. 4).

Then, the electron transport layer 115 is doped with barium (Ba) of approximately 2% wt to 30% wt in order to improve the electron injection properties. The electron transport layer 115 for example has a film thickness of 0.5 nm to 50 nm.

(6) Cathode Forming Process

After formation of the electron transport layer 115, a transparent metal film such as an ITO film is formed as a cathode 117. The cathode 117 is formed by using a vacuum deposition method such as the sputtering method and the vacuum evaporation method (see section (*c*) of FIG. 4). The cathode 117 has for example a film thickness of 10 nm to 200 nm.

(7) First Passivation Layer Forming Process

After formation of the cathode 117, a metal oxide film such as a silicon oxide (SiO) film is formed as a first passivation layer 121. The first passivation layer 121 is formed by a vacuum deposition method such as the sputtering method and the vacuum evaporation method (see section (*a*) of FIG. 5). The first passivation layer 121 for example has a film thickness of 5 nm to 200 nm.

(8) Oxygen Exposure Process

The substrate 101 above which the first passivation layer 121 is formed is exposed in an oxygen atmosphere. Although described later, in the case where the electron transport layer 115 is exposed in the oxygen atmosphere, an oxide film is formed in an exposed part of the electron transport layer 115. The exposed part corresponds to the region of the conductive layer and the region of the conductive layer that is exposed in the oxygen atmosphere of the present invention. The substrate 101 is exposed for several sec to several ten sec.

(9) Second Passivation Layer Forming Process

After the oxygen exposure process, an aluminum oxide ($Al_2O_3$) film is formed as a second passivation layer 123. The second passivation layer 123 is formed by the atomic layer deposition (ALD) method in which a material for a film is deposited in an atomic state.

In this example, the aluminum oxide ($Al_2O_3$) film as the second passivation layer 123 is made with use of trimethylaluminium (TMA), and $O_2$ plasma as an oxidation agent.

The second passivation layer 123 is formed by repeating a process of introducing TMA, purging excess molecules, irradiating with 0, plasma, and purging excess molecules several hundred times for several hundred milliseconds to 200 seconds.

The second passivation layer 123 for example has a film thickness of 5 nm to 200 nm.

5. Case where Foreign Substance Attaches to Upper Surface of Electron Transport Layer 115

The display panel 10 is manufactured in a clean atmosphere. However, it is difficult to completely prevent a foreign substance from intruding into the display panel 10 during the manufacturing process.

Figure 6:
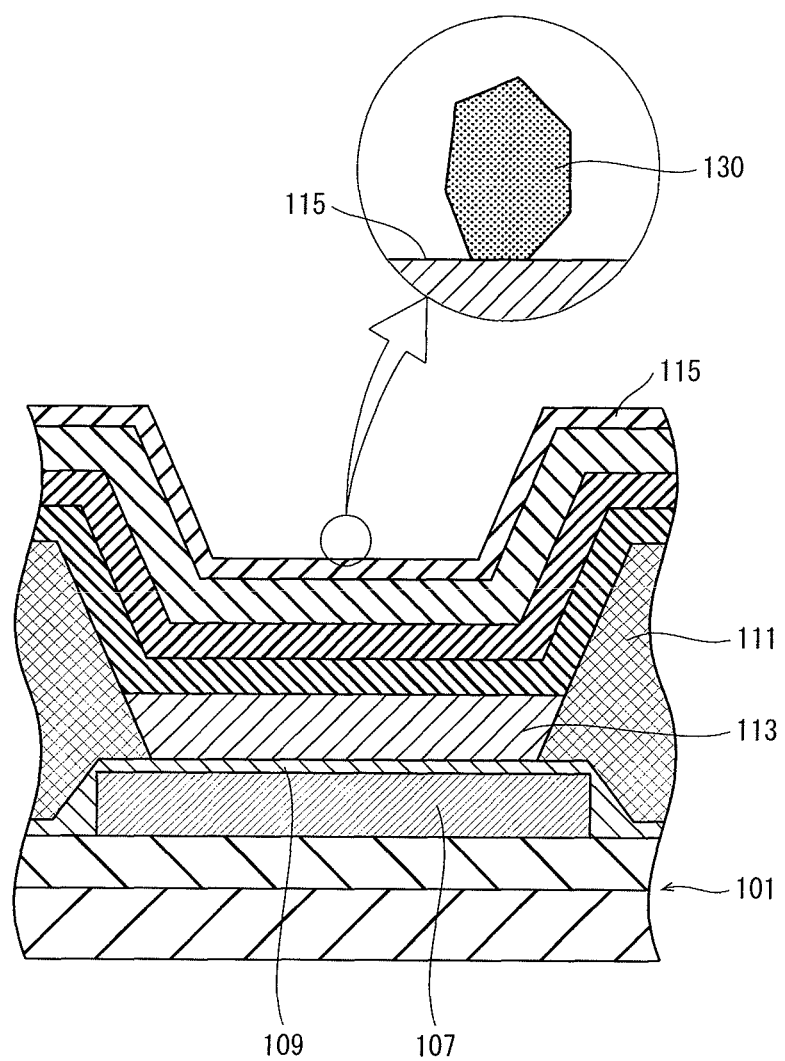
FIG. 6 shows the state where a foreign substance attaches to an upper surface of an electron transport layer.

FIG. 6 shows the state where a foreign substance attaches after the electron transport layer 115 is formed.

Assume a case where a foreign substance 130 attaches as shown in FIG. 6, and the passivation layer (first passivation layer 121 here) is formed by the CVD method. In this case, the cathode 117 and the first passivation layer 121 are not deposited around the foreign substance 130 due to the foreign substance 130 acting as an obstacle, and instead a groove 132 (see section (*a*) of FIG. 7) is generated around the foreign substance 130. In other words, the electron transport layer 115 and the cathode 117 are exposed without being passivated by the first passivation layer 121, and an undesired opening is formed in the cathode 117.

In the case where a layer which is located below the first passivation layer 121 is exposed, an infiltration path of gas such as moisture is formed along the groove 132 as described above. When a resin material for joining to a glass substrate is applied for example, gas infiltrates into the electron transport layer 115 and the cathode 117 from the groove 132. This might cause display defects in the display panel 10.

Furthermore, in the case where the foreign substance 130 is conductive, the electric properties of the electron transport layer 115 greatly vary, and this causes unevenness in light emission or the like.

According to the manufacturing method described in the present embodiment, however, occurrence of failure such as described above is prevented. The following describes reasons for this with reference to the state of the display panel 10 that is manufactured through the above manufacturing process.

Even in the case where the foreign substance 130 attaches to the electron transport layer 115 as shown in FIG. 6, the display panel 10 is manufactured through processes subsequent to the electron transport layer forming process that are performed with no modification.

FIG. 7 shows the state of a foreign substance attaches during the manufacturing process.

(1) Processes to First Passivation Layer Forming Process

The processes included in the manufacturing process of display panel 10 are performed while the foreign substance 130 attaches. Section (a) of FIG. 7 shows the state where the first passivation layer forming process is complete.

As shown in section (a) of FIG. 7, since the foreign substance 130 attaches to the electron transport layer 115, respective layers, which are originally to be formed as the cathode 117 and the first passivation layer 121 above the electron transport layer 115, are formed not above the electron transport layer 115 but above an upper surface of the foreign substance 130.

The respective layers, which are formed above the foreign substance 130, specifically, the respective layers which are made of the same materials as the cathode 117 and the first passivation layer 121, do not have a function relating to light emission and a function of protecting light-emitting parts, and accordingly, are referred to as a cathode film 117b and a first passivation layer film 121b.

As a result, a groove 132 is formed between the foreign substance 130 (including the cathode film 117b and the first passivation layer film 121b which are formed above the foreign substance 130) and each of the cathode 117 and the first passivation layer 121, which are formed around the foreign substance 130.

(2) Oxygen Exposure Process

After the first passivation layer forming process, the oxygen exposure process is performed as described above. In this process, the electron transport layer 115, which is exposed in the oxygen atmosphere, is oxidized (illustrated as an oxide film 134). Especially in the case where the electron transport layer 115 is doped with barium (Ba), the electron transport layer 115 is subject to oxidation. Accordingly, an attachment part of the electron transport layer 115 to which the foreign substance 130 attaches is also oxidized. As a result of oxidation of the attachment part, the foreign substance 130 is fixed to the electron transport layer 115. The state of the attachment part is as shown in section (b) of FIG. 7

Accordingly, in the case where the foreign substance 130 is conductive, insulation of the electron transport layer 115 is ensured with respect to the conductive foreign substance 130 because of oxidation of a peripheral part of the electron transport layer 115 that is peripheral to the foreign substance 130 and includes the attachment part.

(3) Second Passivation Layer Forming Process

After the oxygen exposure process, the second passivation layer forming process is performed to form the second passivation layer by the ALD method as described above, as shown in section (c) of FIG. 7.

The ALD method allows deposition in units of atomic layers. Accordingly, as shown in section (a) of FIG. 7, though the groove 132 is formed around the foreign substance 130, atoms intrude into the groove 132, and are deposited.

As a result, the second passivation layer 123 is also formed on an exposed part of an upper surface of the electron transport layer 115 where the cathode 117 and the first passivation layer 121 are not formed, in the vicinity of the attachment part of the electron transport layer 115 where the foreign substance 130 attaches (part in contact with the foreign substance 130). Accordingly, the exposed part is passivated by the second passivation layer 123.

According to the manufacturing method relating to the present embodiment as described above, even in the case where the foreign substance 130 attaches to the upper surface of the electron transport layer 115, the second passivation layer 123 is deposited in the groove 132 resulting from attachment of the foreign substance 130. This prevents gas such as moisture from infiltrating into the electron transport layer 115, the cathode 117, and the first passivation layer 121 in the subsequent processes.

In particular, although the second passivation layer 123 is formed to be thinner than the first passivation layer 121, the second passivation layer 123 is obtained as a precise film (so called pin-hole free film) because of being deposited in units of atoms. This exhibits high passivation properties.

Furthermore, in the case where the foreign substance 130 is conductive, the oxide film 134 is formed in the exposed part of the upper surface of the electron transport layer 115. Accordingly, insulation is ensured between the electron transport layer 115 and the foreign substance 130. This prevents variation in electrical properties.

Moreover, the second passivation layer 123 is formed on the oxide film 134, on the first passivation layer 121, on the foreign substance 130, above the cathode film 117b and the first passivation layer film 121b which are deposited above the foreign substance 130. As a result, the groove 132 is filled with the second passivation layer 123, and the foreign substance 130 is completely insulated. This prevents gas such as moisture from infiltrating into the oxide film 134.

Also, in the case where the foreign substance 130 is conductive, the foreign substance 130 is fixed to the electron transport layer 115 as a result of oxidation of the electron transport layer 115. Accordingly, it is possible to prevent occurrence of display defects or the like due to the foreign substance 130 blowing onto other part in other process.

<Modifications>

Although the light-emitting element relating to the present invention and the manufacturing method of the light-emitting element have been described above, the present invention is of course not limited to the above embodiment. The present invention for example includes the following modifications.

1. Display Panel (1) Pixel

In the above embodiment, each pixel is composed of three subpixels (three types of subpixels) that differ in luminescent color. However, the number of the subpixels (the number of types of the subpixels) constituting the pixel does not need to be limited to three. Alternatively, the pixel may be composed of subpixels of a single color (monochrome color), or four or more subpixels that differ in luminescent color. The subpixels, which differ in luminescent color, also differ in material and so on for light-emitting layer, but are common in basic structure in which the light-emitting layer is interposed between the anode and the cathode.

(2) Anode

In the above embodiment, the hole injection layer 109 is formed on the upper surface of the anode 107. Alternatively, the following structure may be employed in which a conductive layer is formed on the surface of the anode 107, and the hole injection layer 109 is formed on an upper surface of the conductive layer and the upper surface of the substrate 101 on which the conductive layer is not formed. The conductive layer functions as a protective layer for preventing natural oxidization of the anode 107 during the manufacturing process.

(3) Light-Emitting Layer

In the above embodiment, the light-emitting layer 113 is formed on the upper surface of the hole injection layer 109. Alternatively, a hole transport layer may be provided for example between the light-emitting layer 113 and the hole injection layer 109. The hole transport layer has a function of transporting holes, which are injected by the hole injection layer 109, to the light-emitting layer 113.

Examples of the hole transport layer include triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound and styrylamine compound, butadiene compound, polystyrene derivative, hydrazone derivative, triphenylmethane derivative, and tetraphenylbenzene derivative, which are disclosed in Japanese Patent Application Publication No. H5-163488. In particular, porphyrin compound, as well as aromatic tertiary amine compound and styrylamine compound, are preferable.

(4) Passivation Part

In the above embodiment, the second passivation layer 123 is formed on the upper surface of the first passivation layer 121. Alternatively, a third passivation layer for example may be further formed on an upper surface of the second passivation layer 123. In this case, the third passivation layer may be formed with use of the same material and formation method as those of the first passivation layer 121, or other method such as the CVD method.

Also, in the above embodiment, the second passivation layer 123 is formed on the first passivation layer 121 by the ALD method. In this case, the oxidation exposure process are performed after the light-emitting functional layer forming process.

2. Manufacturing Method
(1) Second Passivation Layer

In the above embodiment, the second passivation layer 123 is formed by the ADL method. In the above embodiment, TMA is used as a material for aluminum oxide forming the second passivation layer 123. Alternatively, other material may be used.

For example, alkyl metal may be used such as triethylaluminium (TEA) and dimethylaluminumhydride (DMAH).

Also, the second passivation layer may be made of other material such as silicon dioxide ($SiO_2$), aluminum nitride (AlN), and aluminum oxynitride ($Al_xO_yN_z$). In the case where aluminum oxynitride is used for example, TMA, TEA, DMAH, and aluminum oxynitride should be reacted with each other.

Furthermore, the second passivation layer 123 may be formed in units of electron layers by other method such as the ALE method.

(2) Oxygen Exposure Process

In the oxygen exposure process, the substrate 101 above which the first passivation layer 121 is formed is exposed in an oxygen atmosphere. Alternatively, other method may be used as long as the electron transport layer 115, the cathode 117, and so on, which are exposed after formation of the first passivation layer 121, are oxidized.

Also, the oxygen atmosphere may contain other gas such as nitrogen and argon as long as oxidation is possible.

Furthermore, in the oxygen exposure process, it is only necessary to oxidize a layer made of a conductive material which is exposed after the light-emitting functional layer. For example, the oxygen exposure process may be performed after formation of the light-emitting functional layer forming process. Specifically, the oxygen exposure process may be performed before formation of the first passivation layer 121.

In the case where ITO that is a transparent conductive film is used for the cathode, an oxide film is difficult to form in the cathode in the oxygen exposure process. Compared with this, in the case where a material that can be oxidized such as metal is used for the cathode, an oxide film is formed in the oxygen exposure process.

3. Opening

In the above embodiment, the second electrode has an undesired opening which results from attachment of a foreign substance to the conductive layer included in the light-emitting functional layer. Furthermore, such an undesired opening can be formed due to other cause such as banks with a distorted shape.

INDUSTRIAL APPLICABILITY

The present invention is utilizable for display devices.

REFERENCE SIGNS LIST 10 display panel
101 substrate
107 anode
113 light-emitting layer
117 cathode
121 first passivation layer
123 second passivation layer

The invention claimed is:

1. A light-emitting element comprising:
a first electrode;
a light-emitting functional layer that is provided on the first electrode, and includes a conductive layer as an uppermost layer thereof, the conductive layer including a conductive material;
a second electrode that is provided on the conductive layer, and has an opening that corresponds to a region of the conductive layer; and
a first passivation layer that is provided on the second electrode except on a periphery of the opening, wherein
a foreign substance is attached to the region of the conductive layer in the opening of the second electrode, and
a portion of the conductive layer to which the foreign substance is attached includes oxide of the conductive material.

2. The light-emitting element of claim 1, wherein
the first passivation layer and the periphery of the opening are covered with a second passivation layer.

3. The light-emitting element of claim 2, wherein
the region of the conductive layer except a part to which the foreign substance is attached is covered with the second passivation layer.

4. The light-emitting element of claim 3, wherein
the foreign substance is covered with the second passivation layer while a layer that is made of a same material as the second electrode and a layer that is made of a same material as the first passivation layer are formed above the foreign substance.

5. The light-emitting element of claim 4, wherein
the light-emitting functional layer includes an organic light-emitting layer, and
the conductive layer is an electron transport layer that transports electrons to the organic light-emitting layer.

6. The light-emitting element of claim 1, wherein
the region of the conductive layer except a part to which the foreign substance is attached is covered with a second passivation layer.

7. The light-emitting element of claim 6, wherein
the foreign substance is covered with the second passivation layer while a layer that is made of a same material as the second electrode and a layer that is made of a same material as the first passivation layer are formed above the foreign substance.

8. The light-emitting element of claim 1, wherein
the light-emitting functional layer includes an organic light-emitting layer, and
the conductive layer is an electron transport layer that transports electrons to the organic light-emitting layer.

* * * * *